(12) United States Patent
Wiltshire

(10) Patent No.: US 6,660,456 B2
(45) Date of Patent: Dec. 9, 2003

(54) TECHNIQUE FOR THE SIZE REDUCTION OF VIAS AND OTHER IMAGES IN SEMICONDUCTOR CHIPS

(75) Inventor: Timothy J. Wiltshire, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 09/893,113

(22) Filed: Jun. 27, 2001

(65) Prior Publication Data

US 2003/0003401 A1 Jan. 2, 2003

(51) Int. Cl.$^7$ ................................. G03C 5/00
(52) U.S. Cl. ................ 430/314; 430/316; 430/394
(58) Field of Search ......................... 430/394, 312, 430/313, 314, 316

(56) References Cited

U.S. PATENT DOCUMENTS

| | | |
|---|---|---|
| 5,017,515 A | 5/1991 | Gill |
| 5,128,278 A | 7/1992 | Harada et al. |
| 5,296,410 A | 3/1994 | Yang |
| 5,330,934 A | 7/1994 | Shibata et al. |
| 5,342,808 A | 8/1994 | Brigham et al. |
| 5,629,238 A | 5/1997 | Choi et al. |
| 5,714,038 A | 2/1998 | Kim |
| 5,719,089 A | 2/1998 | Cherng et al. |
| 5,863,707 A | 1/1999 | Lin |
| 5,895,740 A | 4/1999 | Chien et al. |
| 5,913,148 A | 6/1999 | Hills |
| 5,918,134 A | 6/1999 | Gardner et al. |
| 6,001,743 A | 12/1999 | Lee et al. |
| 6,008,123 A | 12/1999 | Kook et al. |
| 6,033,980 A | 3/2000 | Liou et al. |
| 6,100,014 A | 8/2000 | Lin et al. |

Primary Examiner—Mark F. Huff
Assistant Examiner—Saleha Mohamedulla
(74) Attorney, Agent, or Firm—DeLio & Peterson, LLC; Kelly M. Reynolds; Todd M. C. Li

(57) ABSTRACT

A method of forming openings on a semiconductor wafer comprising an initial step of providing a first film layer over the semiconductor wafer. A first opening in the first film layer is created by transferring an image of the first opening from a photoresist layer into the first film layer using an etching procedure. The first opening includes horizontal and vertical surfaces and has first width and height dimensions. After removing the photoresist layer, a second film layer is deposited over the first film layer and the opening such that the opening has a second width and height dimension which is less than the first width and height dimension. The second film layer is then anisotropically etched from the horizontal surface of the first film layer, and the horizontal surface of the opening such that the opening includes the first height dimension and the second width dimension. The steps of providing the image, creating the first opening, removing the photoresist layer, depositing the second film layer, and anisotropically etching are repeated to provide a second opening in the first film layer. The second opening is adjacent to and a predetermined distance from the first opening, and the first and second openings have different width dimensions.

25 Claims, 8 Drawing Sheets

TECHNIQUE FOR THE SIZE REDUCTION OF VIAS AND OTHER IMAGES IN SEMICONDUCTOR CHIPS

BACKGROUND OF THE INVENTION

1. Field of the Invention

The present invention relates to manufacturing of integrated circuits and, more particularly, to forming openings on a semiconductor wafer.

2. Description of Related Art

In typical integrated circuit silicon wafer manufacturing, creation and integration of circuit patterns and openings or like features includes using a photolithography process or technique. Photolithography techniques are preferably used to form fine resist patterns to define circuits, openings and like features on the silicon wafer. In general, the process includes a light sensitive polymer film for a photoresist being applied to a wafer at a predetermined thickness. Light from a light source passes through a photomask having a predetermined mask (circuit) pattern thereon. The light passing through the photomask forms an aerial image which is projected onto the photoresist on the wafer forming the mask pattern on the photoresist. The photoresists (also known as "resists") are exposed to light and subsequently processed by a development process to leave a patterned resist layer on the wafer. The resists are usually positive resists (the areas exposed to the light are removed by the subsequent development process) or negative resists (the areas not exposed to light are removed by the subsequent development process). The patterned resist layer then acts as an in-situ stencil for further processing, which can include Reactive Ion Etch (RIE), Ion Implant (II), Wet Etch (WE), and other processing steps. There are many variations on the technique of printing images in a photoresist film using light projected through a mask. The "standard" technique would be to print all the images at a given process level at one time through a single mask. After printing the images on the substrate, subsequent etching and/or depositions (or combinations thereof) are done to form the desired structures.

More specifically, existing methods or processes start with a silicon (or other kind of) semiconductor substrate or wafer with various films and possibly prior level patterns on it. This substrate can then be spin coated with a layer of photoresist. Sometimes a layer of anti-reflective coating is put onto the substrate before applying the photoresist. The substrate is then processed in some type of light exposure system. The areas of the photoresist where light strikes react with the light. The reaction varies depending on the type of photoresist used, the exposure wavelength used, the subsequent processing conditions, and other variables. The substrate is illuminated using a mask of some sort that intentionally illuminates some areas and intentionally prevents illumination in other areas. The substrate is subsequently processed to remove the photoresist in either the illuminated regions or the unilluminated regions depending on the photoresist type, the temperature and time of baking, and the type of chemical used to dissolve the designated areas of either reacted or unreacted photoresist (the chemical used for this dissolution is commonly known as "developer"). The remaining photoresist forms an in situ "stencil" or "mask" on the substrate. The next step in the process includes processing the substrate to form the desired feature type. In the case where the substrate has a dielectric level, and the desired features are small metal lines or small metal studs, the substrate is typically subjected to a reactive ion etch (RIE) process that would selectively etch the dielectric from areas of the substrate where the photoresist had been removed previously. The remaining photoresist is typically removed by an oxygen plasma strip process. Finally, a blanket metal may be deposited (either by evaporation or plating or some other suitable technique), and then the excess metal is removed by a chemical-mechanical polish operation.

In the fabrication of integrated circuit devices, high integration is desirable. To achieve this goal the various components in the integrated circuit are made with the smallest possible dimensions. Current semiconductor fabrication technologies available are able to fabricate integrated circuits down to and below 0.13 $\mu$m image size. The photolithography process is instrumental in the fabrication of semiconductors and related semiconductor structures such as, doped areas, and contact openings. In submicron integration, the photolithographic transfer of a pattern from a mask is highly critical. Various methods such as Optical Proximity Correction (OPC), and Phase Shift Masking (PSM), have been proposed to achieve high definition for the pattern transfer from a mask through photolithography onto a photoresist layer. Although existing methods (such as PSM) enhance the pattern definition in fabrication of integrated circuits they are complex and costly.

Typical integrated circuit manufacturing processes often involve the creation of openings in various materials by selective etching. For example, openings or trenches can be made in a substrate to provide isolation between individual devices or to provide capacitive charge storage. Other openings, such as vias, or windows, can be made in dielectric layers to facilitate connection between two layers of metallization or between a metallization layer and an active region of a transistor. Commonly, these openings are created by etching a material deposited on a semiconductor wafer to create openings. The openings may be subsequently filled with appropriate materials. For example, a trench may be filled with insulative material to facilitate inter-device isolation. The trench may also be used for capacitive storage, in which case the trench may be lined with one or more layers of insulator films and filled with conductive material. Vias may be subsequently filled with a conductive material, for example a metal providing a conductive link between two layers of metallization.

Another method uses computer software to compute the dimensions and positional deviations between the resulting patterns on the photoresist layer and the predefined patterns on the mask, and then, uses the data for correction of the size and position of the patterns on the mask. However, a disadvantage of this method is that it requires complex computing to obtain the needed corrections to the mask patterns, and can therefore be difficult or expensive to implement.

The manufacturing cost of a given integrated circuit is largely dependent upon the chip area required to implement desired functions. The chip area is defined by the geometries and sizes of the active components such as gate electrodes in metal oxide semiconductor (MOS) and diffused regions such as source and drain regions and bipolar emitters and base regions. These geometries and sizes are often dependent upon the current photolithographic equipment and materials available in the industry.

Conventional technology used in forming contacts and vias has been done primarily through improvements in photolithography capability. The dependency on the photolithography to achieve adequate projections of images or patterns onto the wafer surface is limited by the photolithography equipments' capability, especially as feature sizes continue to decrease.

In fabricating an integrated circuit, apertures, windows or vias are often formed in a layer of insulator material in order to provide a contact to a second layer to electrically connect the second layer to a third layer that is on an opposite side of the insulator layer. The functional area on a semiconductor device is valuable, and the dimensions of these apertures are often made as small as fabrication limitations allow. Therefore, it is necessary to precisely control the diameter of any aperture that is formed in a layer.

Current methods of photolithography in computer microchip miniaturization produce chips containing in the hundreds of thousands or more transistors. Fabrication of these features is dependent on the resolution or the optical system's ability to distinguish closely spaced objects. The resolution of the system is an important limitation in achieving minimum device sizes required. In establishing the horizontal dimensions of the various devices and circuits, a pattern must be created which meets design requirements and be correctly aligned to the circuit pattern on the surface of the wafer. As line widths shrink smaller in submicron photolithography, the process of printing lines and contact holes in photoresist becomes increasingly more difficult. Some improvements in photolithography capability have enabled reduction in size of contacts, vias, metal lines and other features. The dependency on photolithography to achieve adequate projection of images of patterns onto the wafer surfaces is limited by the photolithography equipment's capability, especially as feature sizes continue to decrease.

A conventional technique for forming an aperture through an insulator layer to provide access to a lower level conductive layer is to apply or spin a photoresist to the insulator layer and to pattern the photoresist using a photolithographic mask to expose regions of the insulator layer. Plasma etching or reactive ion etching then removes material from the insulator layer, forming apertures at the exposed regions. After removal of the photoresist, a conductive material is deposited within the apertures to electrically connect with the lower level conductive layer. Various factors limit the minimum horizontal dimension of an aperture formed in this manner. For example, aperture size is limited by the resolution of the lithography. In addition to problems involving the size of the aperture, there can be problems with misalignment to the lower conductive layer.

A typical prior art method of forming a conductive pattern may include forming a first insulating film over a semiconductor substrate, then forming a contact hole by selectively etching a portion of the first insulating film, and successively etching a recess portion of the semiconductor substrate corresponding to the contact hole. A second insulating film is then formed over the entire surface of the first insulating film including the inner surface of the contact hole, and then etching the second insulating film using an anisotropic etching process so that the bottom surface of the recess is exposed and a side wall coating remains in the contact hole. The side wall coating is formed of the second insulating film, extends below the lower surface of the first insulating film and into the recess portion of the substrate.

Current lithography equipment cannot print images in photoresist below a certain dimension. Normal processing would require that some sort of pattern transfer technique (such as reactive ion etching) would be used to transfer an image into a dielectric material. This etched image in the dielectric would them be filled with a conducting material (such as a metal or appropriately doped polysilicon). The lower limit on the size of these etched images is limited by multiple factors including, the imaging capability of the lithography equipment being used, the performance of the photoresist (or other photo imaged) material, and the pattern transfer equipment/process capability.

A shortcoming in existing methods is that the density and lower size limit of the images that can be printed are restricted. Using existing methods, the image size that can be printed through a mask has a lower limit typically given by the formula $$\text{Resolution} = (k1 * \text{wavelength})/(NA)$$

Where "wavelength" is the wavelength of the exposing light, "NA" is the effective numerical aperture of the exposure lens being used, and k1 is a constant that depends on the type of mask, the photoresist properties, and other physical parameters. NA has an upper limit value of 1 (it is the sine of an angle). For a given wavelength, it is generally accepted that the physical lower limit on k1 for conventional optical transmission lenses is approximately 0.25. In practice, however, a k1 value of 0.25 is difficult to achieve and k1 values of 0.5 to 0.8 are typical for industry manufacturing processes. The density of the images that can be achieved are directly related to the resolution. If the minimum image that can be resolved is given as "Q", and the minimum space between images of size "Q" that can be achieved is "R", then it is as follows:

The maximum density of images would be given as $1/((Q+R)*(Q+R))$. There would be one image of dimensions Q by Q in an area $(Q+R)*(Q+R)$.

Bearing in mind the problems and deficiencies of the prior art, it is therefore an object of the present invention to provide a method for achieving device sizes below the current photolithography capability.

It is another object of the present invention to provide a method for increasing circuit component density on a wafer in an integrated circuit.

It is yet another object of the present invention to provide a method for simultaneously achieving device size below the current photolithography capability and increase component density on a wafer on an integrated circuit.

A further object of the invention is to provide an efficient and effective method for increasing circuit component density on a wafer in an integrated circuit.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming openings on a semiconductor wafer. An initial film layer is deposited over the semiconductor wafer, then a first photoresist layer is deposited over a surface of the initial film layer. Preferably, the initial film layer includes a dielectric. An initial image is provided including a first opening in the first photoresist layer using a photolithographic technique. A first opening is created in the initial film layer by transferring the image of the first opening into the initial film layer using an etching procedure. The first photoresist layer is removed, and a second photoresist layer is deposited on the initial film layer.

Another image is provided including a second opening in the second photoresist layer using the photolithographic technique. The second opening is created in the initial film layer by transferring the image including the second opening into the initial film layer using the etching procedure. The second opening is positioned adjacent to and having a predetermined distance from the first opening. The predetermined distance between the first and second openings is less than a distance achieved by the photolithographic technique using a single photoresist exposure. Preferably, the first and second openings include vias. The second photoresist layer is removed and a final film layer is deposited over the initial film layer and the first and second openings such that the final film layer covers a horizontal surface of the initial film layer and covers horizontal and vertical surfaces of the first and second openings. Preferably, the final film layer includes a dielectric. The final film layer is anisotropically etched from the horizontal surfaces of the first and second openings and the horizontal surface of the initial film layer. Additionally, the first and second openings may include interconnecting lines.

In a related aspect, the present invention further comprises depositing a layer of conductive material on the surface of the initial film layer filling the first and second openings, and also removing the conductive material from the horizontal surface of the initial film layer.

Another aspect of the present invention relates to a method of forming openings on a semiconductor wafer which comprises depositing an initial film layer over the semiconductor wafer. A first photoresist layer is deposited over a horizontal surface of the initial film layer, then a first opening in the first photoresist layer is provided using a photolithographic technique having a first image. The first opening in the initial film layer is created by transferring the first opening into the initial film layer using an etching procedure. The first opening includes a horizontal surface and a vertical surface, and further includes a first width dimension and a first height dimension. The first photoresist layer is removed from the initial film layer, and a second film layer is deposited over the horizontal surface of the initial film layer and over the vertical and horizontal surfaces of the first opening such that the first opening includes a second width dimension and a second height dimension being less than the first width and height dimensions. The second film layer is anisotropically etched from the horizontal surface of the initial film layer and from the horizontal surfaces of the first opening such that the first opening includes the first height dimension and the second width dimension. A second photoresist layer is deposited over the horizontal surface of the initial film layer.

A second opening in the second photoresist layer is provided using the photolithographic technique having a second image. The second opening in the initial film layer is created by transferring the second opening in the second photoresist layer into the initial film layer using the etching procedure. The second opening is positioned adjacent to and having a predetermined distance from the first opening. Preferably, the predetermined distance between the first and second openings is less than a distance achieved by the photolithographic technique using a single photoresist exposure. The second opening includes horizontal and vertical surfaces, and the second opening further includes a first width dimension and a first height dimension. Moreover, the first and second openings may include vias. Then, the second photoresist layer is removed. A third film layer is deposited over the initial film layer and the horizontal and vertical surfaces of the first and second openings such that the second opening includes a second width dimension and a second height dimension being less than the first width and height dimensions of the second opening. Further, the first opening includes a third width dimension and a third height dimension where the third width dimension is less than the second width dimension. Preferably, the initial, the second, and the third film layers include a dielectric. Further, the first and second openings may include interconnecting lines. The third film layer is anisotropically etched from the horizontal surface of the initial film layer, and the horizontal surfaces of the first and second openings such that the second opening includes the first height dimension and the second width dimension, and the first opening includes the first height dimension and the third width dimension.

In a related aspect of the present invention, a conductive material film layer is deposited over the initial film layer which fills the first and second openings. Then, the conductive material film layer is removed from the horizontal surface of the initial film layer.

Yet another aspect of the present invention provides a method of forming openings on a semiconductor wafer comprising an initial step of providing a first film layer on a horizontal surface of the semiconductor wafer. The semiconductor wafer preferably comprises silicon. A layer of antireflective coating may be applied onto a top surface of the wafer before providing a photoresist layer and an image. Next, an image is provided of a first opening on a photoresist layer using a photolithographic technique, the photoresist layer is positioned on a horizontal surface area of the first film layer. The first opening in the first film layer is created by transferring the image of the first opening on the photoresist layer into the first film layer using an etching procedure. The opening includes horizontal and vertical surfaces and further defines first width and height dimensions. The photoresist layer is then removed. The steps of providing the image, creating the first opening, and removing the photoresist layer are repeated to provide a second opening in the first film layer. The second opening is adjacent to and has a predetermined distance from the first opening. The predetermined distance between the first and second openings is less than a distance achieved by a photolithographic technique using a single photoresist exposure. Preferably, the first and second film layers include a dielectric.

A second film layer is deposited over the first film layer and the horizontal and vertical surfaces of the openings such that the openings have a second width and a second height dimension being less than the first width and height dimensions. The second film layer is anisotropically etched from the horizontal surface area of the first film layer and from the horizontal surfaces of the openings such that the openings include the first height dimension and the second width dimension. A conductive material film layer is deposited over the first film layer which fills the openings. Then, the conductive material film layer is removed from the horizontal surface area of the first film layer.

A further aspect of the present invention provides a method of forming openings on a semiconductor wafer comprising an initial step of providing a first film layer over the semiconductor wafer. The semiconductor wafer preferably comprises silicon. A layer of antireflective coating deposited onto a top surface of the wafer may be applied before providing an image on a photoresist layer. An image of a first opening on a photoresist layer using a photolithographic technique is provided where the photoresist layer is positioned over a horizontal surface of the first film layer. The first opening in the first film layer is created by transferring the image of the first opening on the photoresist layer into the first film layer using an etching procedure. The first opening includes horizontal and vertical surfaces and has first width and height dimensions. The photoresist layer is then removed. A second film layer is deposited over the first film layer and the opening such that the opening has a second width and height dimension which is less than the first width and height dimension. The second film layer is then anisotropically etched from the horizontal surface of the opening such that the opening includes the first height dimension and the second width dimension. Further, the second film layer is anisotropically etched from the horizontal surface of the first film layer. The first and second film layers may preferably include a dielectric.

The steps of providing the image, creating the first opening, removing the photoresist layer, depositing the second film layer, and anisotropically etching are repeated to provide a second opening in the first film layer. The second opening is adjacent to and a predetermined distance from the first opening, and the first and second openings have different width dimensions. A conductive material film layer is deposited over the first film layer which fills the openings. Then the conductive material film layer is removed from the horizontal surface of the first film layer.

Another aspect of the present invention provides a method of forming openings on a semiconductor wafer comprising depositing an initial film layer over the semiconductor wafer. Then, a photoresist layer is deposited over a horizontal surface of the initial film layer. An opening in the photoresist layer is provided using a photolithographic technique which has an image. The opening in the initial film layer is created by transferring the opening in the photoresist layer into the initial film layer using an etching procedure. The opening includes horizontal and vertical surfaces. The photoresist layer is then removed.

The steps of depositing the photoresist layer, providing the opening, creating the opening, and removing the photoresist layer are repeated to provide additional openings being adjacent to and a predetermined distance from each other. An additional film layer is deposited over the initial film layer and the horizontal and vertical surfaces of the openings. Next, the additional film layer is etched from the horizontal surfaces of the openings, and the horizontal surface of the initial film layer. In a preferred embodiment, the steps are performed in the sequence provided.

In a related aspect of the present invention the step which includes repeating the steps of depositing the photoresist layer, is performed after the steps of depositing an additional film layer, and anisotropically etching. Further, the step of repeating the steps of depositing the photoresist layer includes repeating the steps of depositing the additional film layer, and anisotropically etching.

A further related aspect of the present invention provides depositing a conductive material film layer over the horizontal surface of the initial film layer which fills the openings, and removing the conductive material film layer from the horizontal surface of the initial film layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

Figure 1:
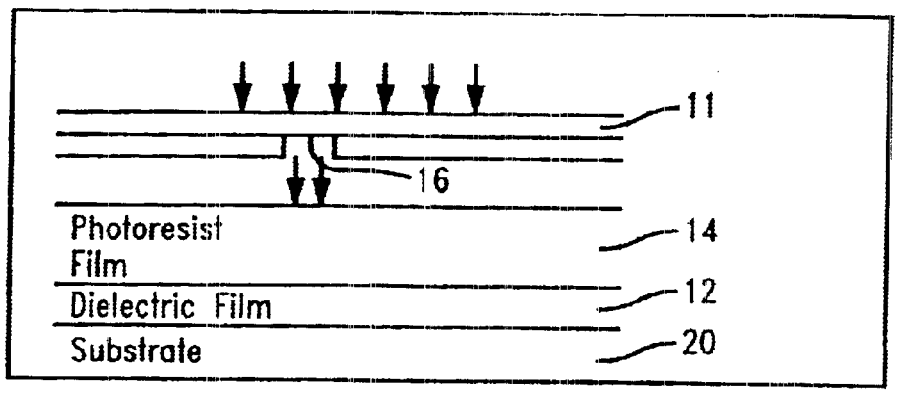
FIG. 1 is a process flow depicting the steps of existing technology for manufacturing a via on a semiconductor wafer including using imaging techniques.
Figure 1:
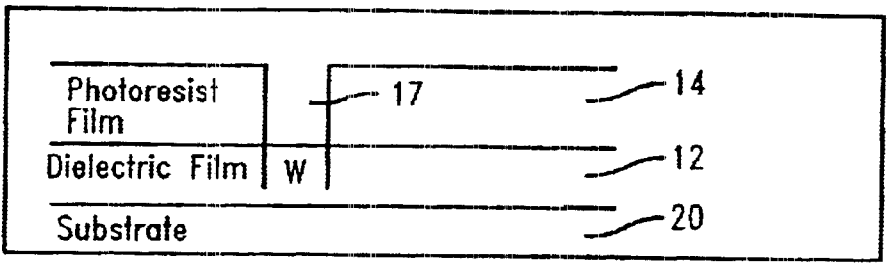
Figure 1:
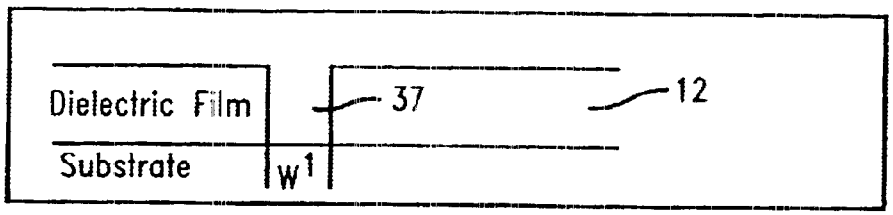
Figure 1:
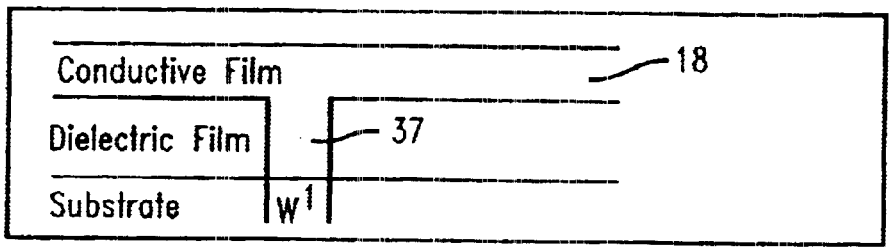
Figure 1:
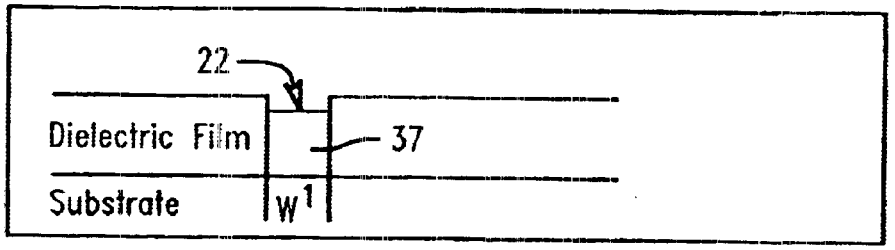

In describing the preferred embodiment of the present invention, reference will be made herein to FIGS. 1–6 of the drawings in which like numerals refer to like features of the invention. Features of the invention are not necessarily shown to scale in the drawings.

The present invention includes combining a technique for reducing the achieved image size ("Q"), with a technique for reducing the minimum space achievable between two images of minimum resolution size ("R"), to increase the maximum achievable image density. The advantage of this invention includes a higher density final image. The number of circuits that a semiconductor manufacturer can put on a microchip and the speed of those circuits is often a direct function of the maximum image density for a given process. Thus, increased image density can result in an increased number of circuits in the same area, thereby increasing the achievable speed of the chip.

If "Qi" is the minimum image size achievable in this invention and "Ri" is the minimum space achievable between adjacent images of size "Qi", then the maximum density of images could be given as $1/((Qi+Ri)*(Qi+Ri))$. For example, where Q=1 and R=1, and the invention allows a normalized "Qi" of 0.7 and a normalized "Ri" of 0.7, then the final achievable image density comparison would be:

Starting maximum density $1/((1+1)*(1+1))=0.25$

Invention maximum density $1/((0.7+0.7)*(0.7+0.7))=$ 0.51 (rounded to the hundredths decimal place)

In the present invention, a technique is described to "shrink" the minimum dimension that the conductive material can be fabricated to by using a post-etch deposition and subsequent anisotropic etch of a dielectric material.

Referring to FIG. 1, a known and existing technique is shown in a process flow 10 illustrating a method for manufacturing vias on a semiconductor wafer used in integrated circuit manufacture. The process 10 includes a first step 31 showing a dielectric film material layer 12 positioned between a photoresist layer 14 and a substrate or semiconductor wafer 20. An opening 16 is present in a mask 11 to expose a specified area of the photoresist film layer 14. The photoresist film layer 14 is exposed using typical photolithographic techniques to produce an image having a feature in the photoresist film layer 14. In the next step 32, the exposed feature is developed to produce a trench 17 in the photoresist film layer 14. In the following step 33, the dielectric film layer corresponding with the trench 17 is treated using reactive ion etching to produce a via 37 in the dielectric film layer 12 having a width "W", and the remaining photoresist film 14 is stripped away. The resulting dielectric film via width is $W^1$ which corresponds to the resist image width W by the etch bias e, and represented by the equation: $W^1=W+e$. Next, in step 34, a conductive film 18 is put over the dielectric layer 12 including the via 37. The final step 35 includes removing the excess conductive material 18, leaving the via 37 with a layer of conductive film 22.

Figure 2:
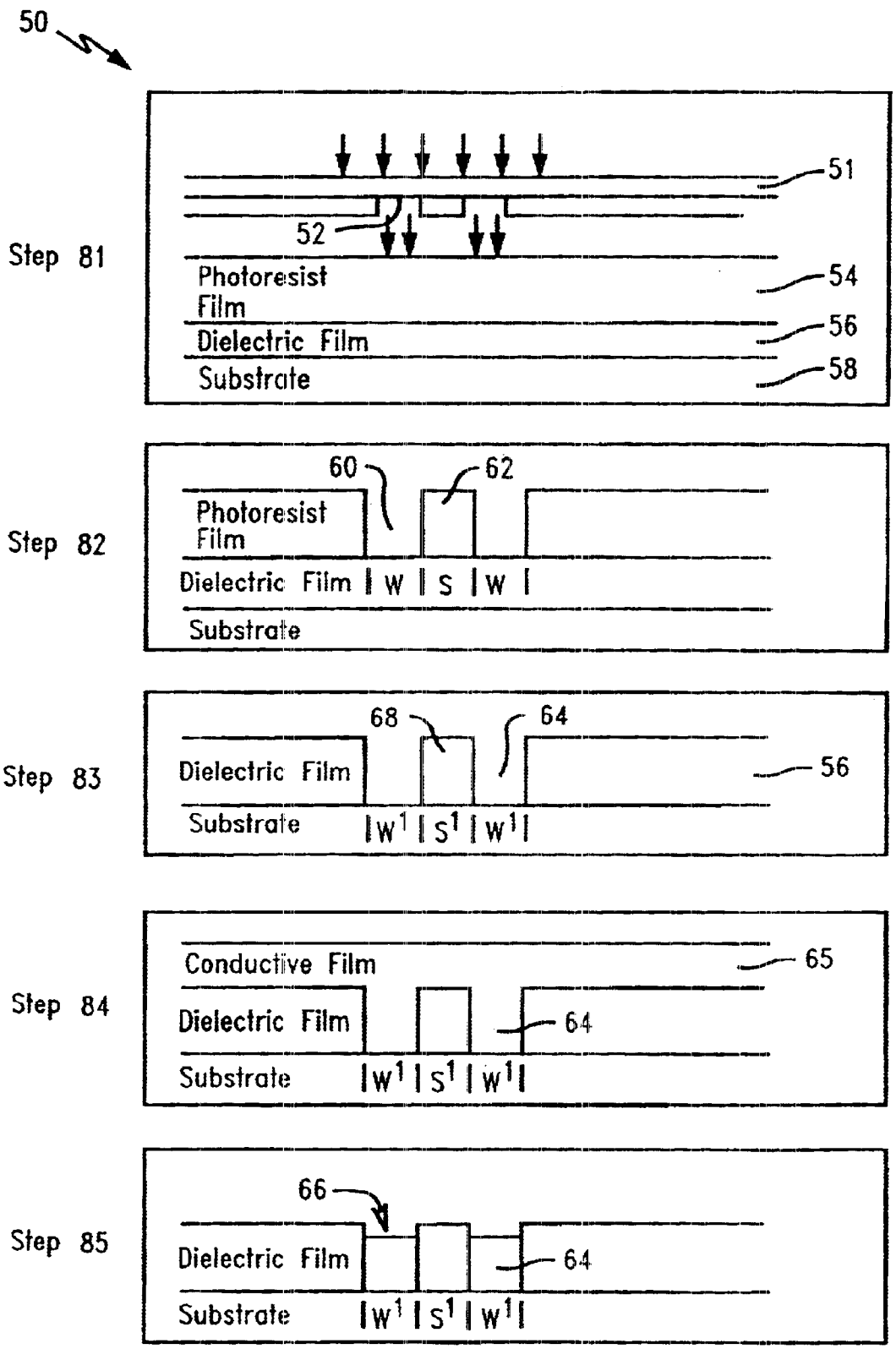
FIG. 2 is a process flow depicting the steps of existing technology for manufacturing vias on a semiconductor wafer using a single exposure process.

FIG. 2 shows a known process 50, similar to the process shown in FIG. 1, however, the process of FIG. 2 results in multiple feature images including vias 52. The first step 81 includes a dielectric film layer between a photoresist film layer 54 and a substrate or semiconductor wafer 58. Further, the first step 81 includes providing a mask 51 having openings 52 to expose the photoresist film layer 54 beneath it. The photoresist film layer 14 is exposed using typical photolithographic techniques. In the next step 82, the exposed photoresist film is removed to provide two trenches 60 in the photoresist layer. The trenches 60 have width "W" and a first space portion 62 of photoresist 54 between the trenches having a width "S". The minimum value of S is limited by diffraction effects of the exposure light being used and the mechanical stability of the photoresist of width S. The next step 83 includes using reactive ion etching to provide vias 64 in the dielectric film layer 56, and stripping away the remaining photoresist. The vias 64 have a width "$W^1$", and a second space portion 68 of dielectric film material 56 between the vias 64 has a width $S^1$. The width of the etched images $W^1$ and the space portion between then $S^1$ are related to the width of the developed resist images W and the space portion between them S by the etch bias "e" represented by: $W^1=W+e$ and $S^1=S-e$. In the next step 84 a blanket deposition of a conductive film is placed over the dielectric film 56 which covers and fills the vias 64. The final step 85 is to remove the excess conductive material 65 from the dielectric and leave the vias 64 with a layer of conductive material 66.

Figure 3:
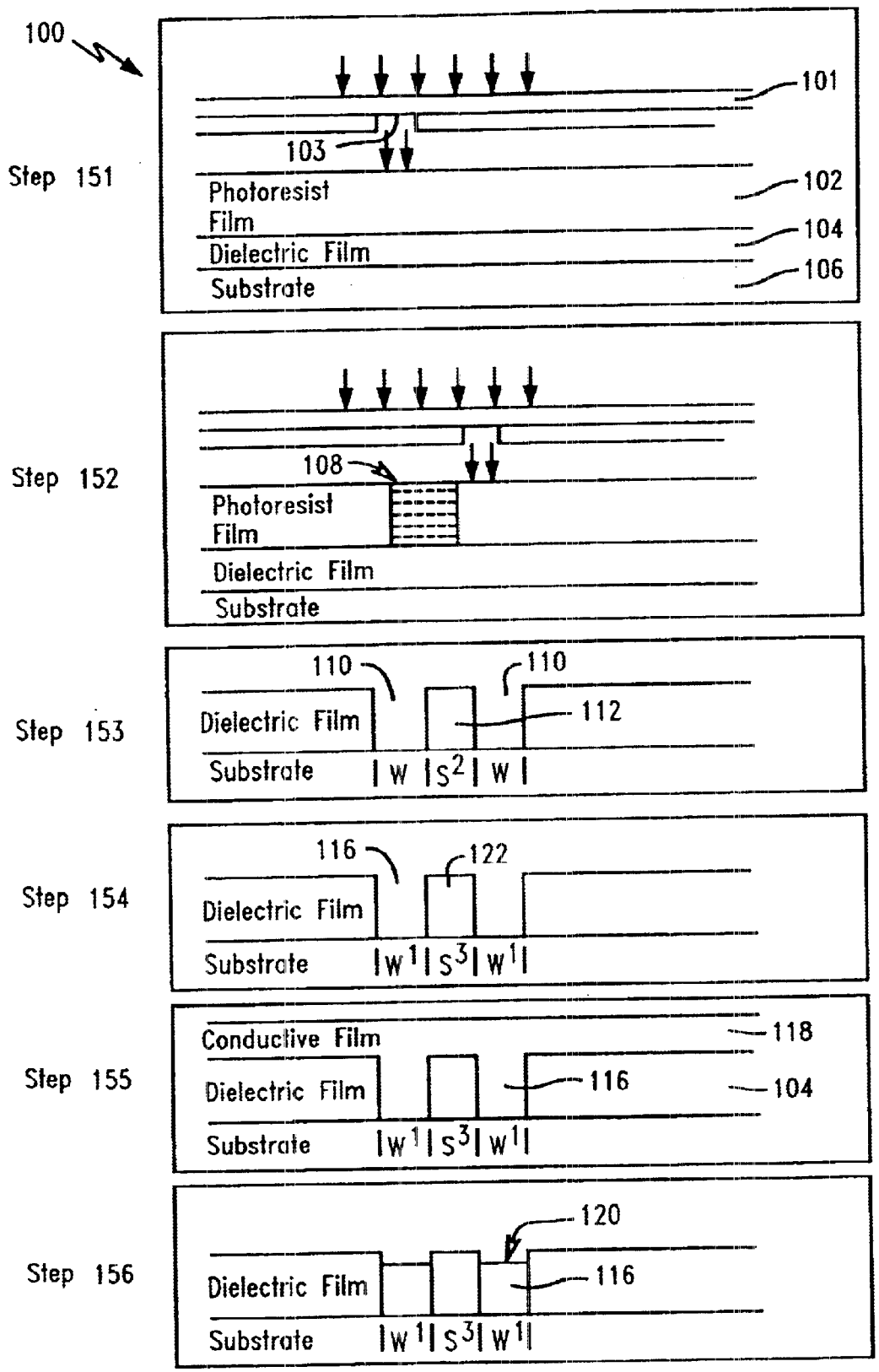
FIG. 3 is a process flow depicting the steps of existing technology for manufacturing vias on a semiconductor wafer using a double exposure process.

Referring to FIG. 3, a known process 100 is illustrated having a first step 151 providing a mask 101 having an opening 103 for exposing the photoresist film layer 102 with image features. As in the previous embodiments shown in FIGS. 1–2, the image features includes a via to be developed in the dielectric layer 104. The photoresist film 102 is first exposed to create an image 108, and then exposed a second time to create another of the same image 108, as shown in the next step 152, using typical photolithographic techniques. In the next step 153, the images are developed and the exposed regions of the photoresist are removed to form the vias 110 having a width "W". The vias define a space portion of photoresist material between them having a width of $S^2$. The minimum size of $S^2$ depends on factors which include the mechanical integrity of a resist space portion of dimensions $S^2$ during the development process. The next step 154, includes using reactive ion etching of the dielectric layer to produce vias 116, and a space portion between the vias 122 having a width $S^3$. The via widths $W^1$ and the space portion width $S^3$ are related to the developed resist image widths W and the developed resist image space portion $S^3$ by the etch bias e, represented by: $W^1=W+e$ and $S^3=S^2-e$. In the next step 155 a blanket deposition of conductive material is deposited over the dielectric film including the vias 116. In the final step 156, the conductive material 118 is removed from the dielectric layer leaving the vias 116 with a layer of conductive material 120. The size of the final image is the same as in FIG. 2, however, the spacing $S^3$ between the images has decreased from $S^1$ in FIG. 2, to $S^3$ in FIG. 3, thereby increasing the overall image density.

Figure 4:
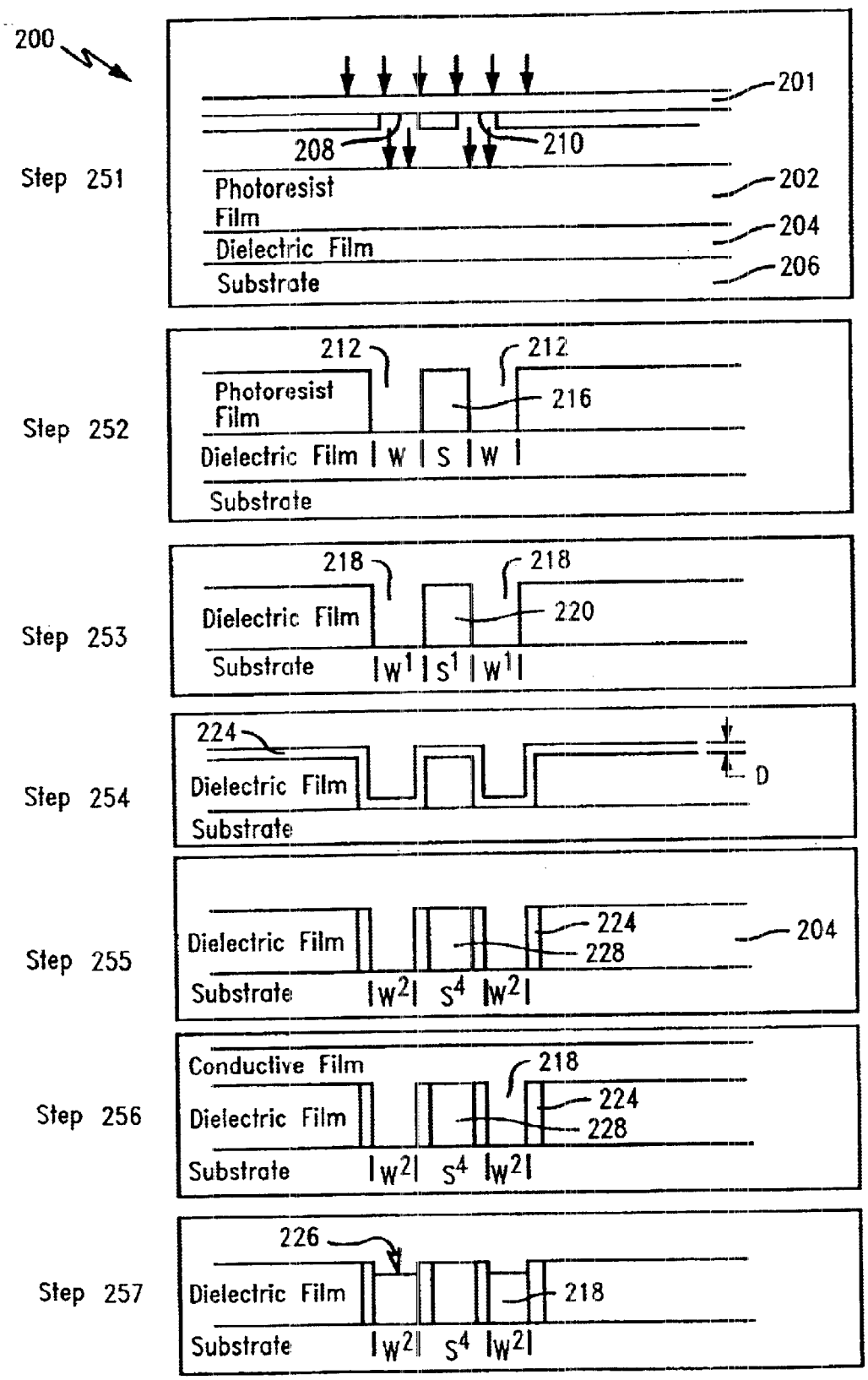
FIG. 4 is a process flow depicting the steps of existing technology for manufacturing vias on a semiconductor wafer and illustrating a sidewall deposition.

Referring to FIG. 4, a known process 200 is illustrated showing sidewall deposition. In the first step 251, an image is created on photoresist film 202 using a mask 201 to produce multiple images with one exposure using typical photolithographic techniques, as in the embodiments shown in FIGS. 1–3. The next step 252, shows vias 212 formed in the photoresist film layer 202 after exposure, having a width W, and a space portion between the vias 212 of S. The minimum value of S is limited by diffraction of the exposure light being used and the mechanical stability of the photoresist of width S. In the next step 253, reactive ion etching is used followed by stripping of the remaining photoresist material 202 resulting in vias 218 in the dielectric material 204. The vias 218 in the dielectric material have a width $W^1$, and the dielectric space 220 between the vias 218 has a width $S^2$. The next step 254 includes providing a blanket deposition of dielectric film having a thickness "d" over the dielectric layer 204 and in the vias 218. The vias thus have their width reduced by twice the thickness d of the dielectric film, and define a portion of dielectric between them 228 having a width of $S^4$. The portion 228 is created by the first dielectric film layer 204 and the added dielectric film having thickness d. In the next step 255, an anisotropic reactive ion etch of the dielectric layer is completed leaving the vias 218 having a width of $W^2$. The final dimension of the width $W^2$ is represented by: $W^2=W^1-2.0*d=(W+e)-2.0*d$; and $S^4=S^1+2.0*d=(S-e)+2.0*d$. The final steps 256 and 267, includes adding a layer of conductive material over the dielectric and removing the excess, leaving the vias 218 with a layer of conductive material 226.

Figure 5:
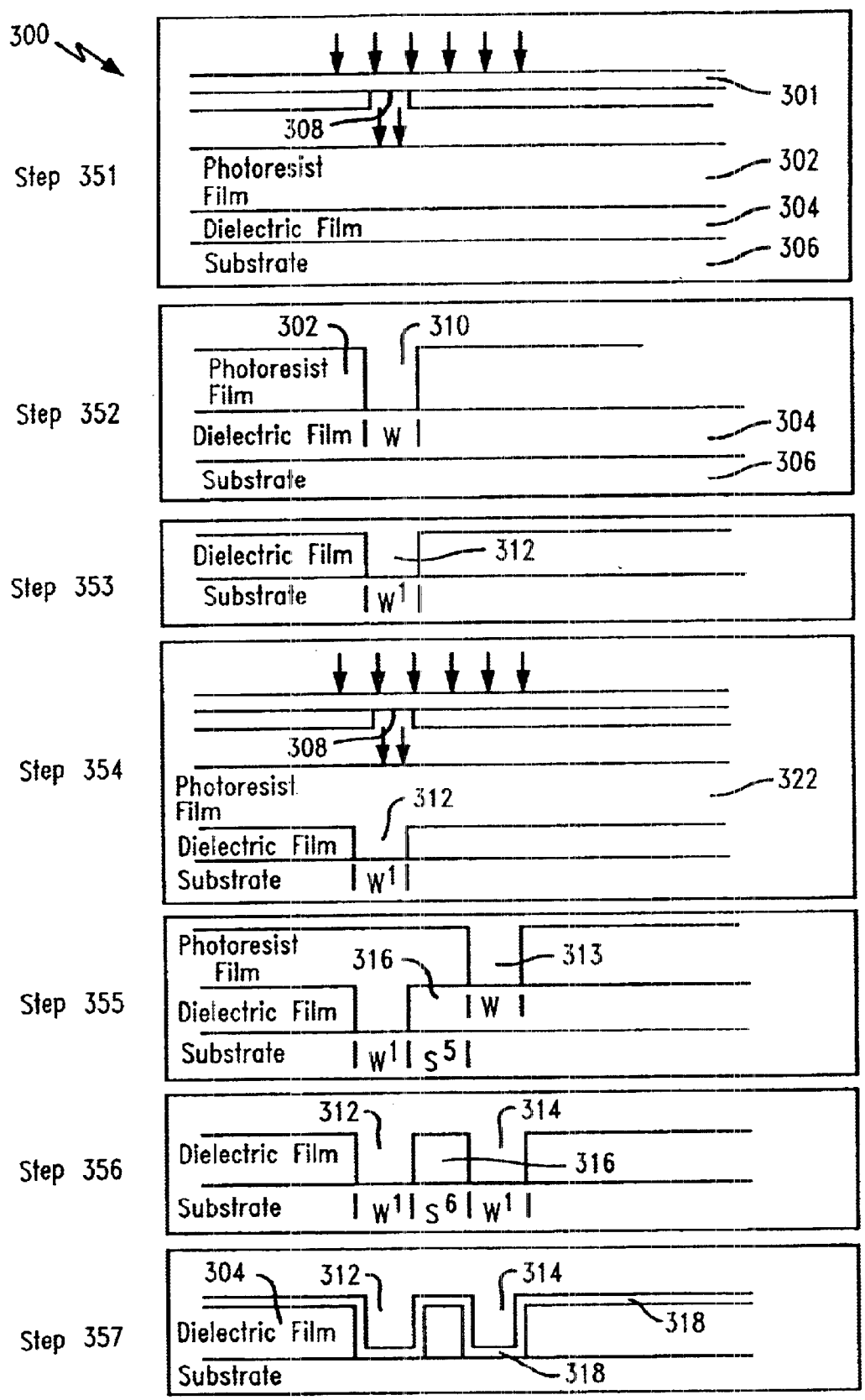
FIGS. 5–5A is a process flow showing a preferred embodiment of the present invention depicting the steps of manufacturing vias on a semiconductor wafer using photolithography, a double exposure process, and a single side wall deposition.
Figure 5A:
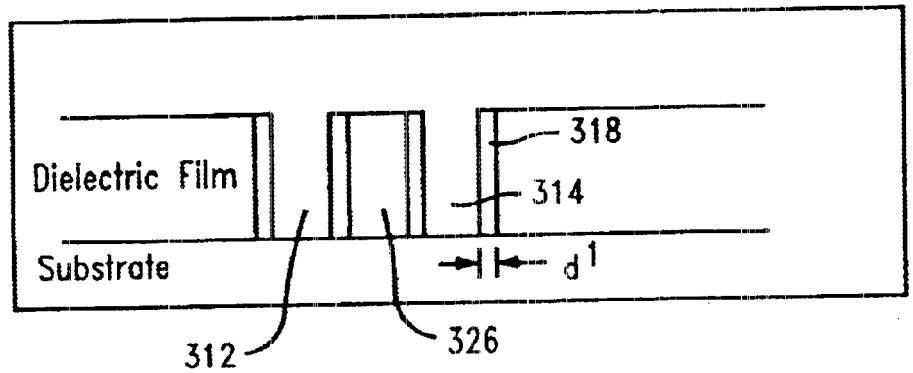
Figure 5A:
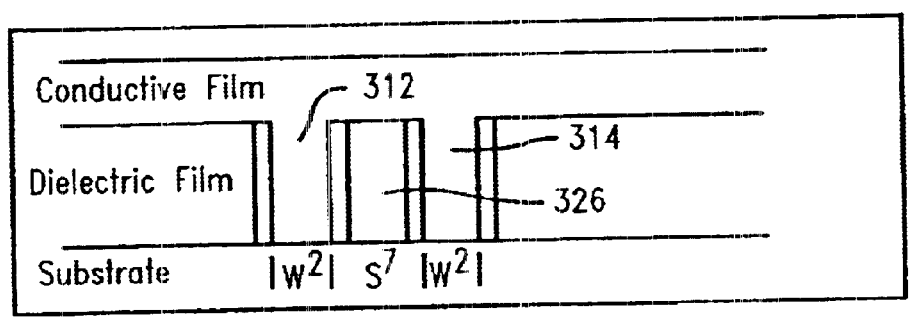
Figure 5A:
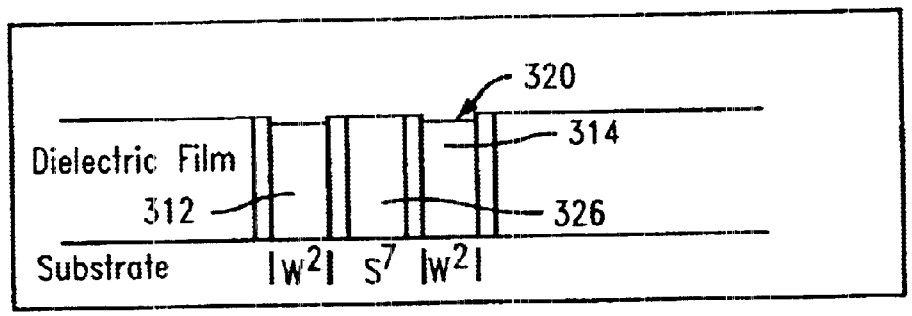

Referring to FIGS. 5–5A, a process 300 is shown which illustrates an embodiment of the present invention which includes a multiple exposure, and a sidewall deposition after the images are etched into the dielectric material. A first step 351 includes a mask having an opening 308 allowing the photoresist layer 302 below to be exposed. A dielectric film layer 304 is positioned between a semiconductor substrate or wafer 306 and a photoresist film layer 302. A layer of antireflective coating (not shown) may be applied to the top surface of the substrate before depositing a photoresist layer. In the embodiment depicted in FIGS. 5–5A, the next step 352 shows the image developed on the photoresist and the exposed region being removed providing a via 310 having a width W in the photoresist layer 302. The next step 353 includes using reactive ion etching to transfer the image into the dielectric film layer 304 to provide a via 312. The remaining photoresist is stripped off the dielectric film layer 304. The width of the via 312 is $W^1$ and is represented by the equation: $W^1=W+e$.

The next step 354, includes depositing a second layer of photoresist 322 over the dielectric film 304 and the via 312 using the mask 301 and photolithographic technique of step 351. The next step 355, includes developing the exposed photoresist to create a via 313 in the photoresist layer 322. The via 313 is positioned adjacent to the first via 312 defining a space portion 316 having a width $S^5$ between the first via 312 and the second via 313. The space portion $S^5$ can be made significantly smaller than the space portion $S^3$ shown in FIG. 3 (step 153), because $S^5$ is not limited by the mechanical integrity of a small resist island during the development process.

In the next step 356, the photoresist image is transferred to the dielectric film 304 using reactive ion etching to transfer the via 316 into the dielectric film layer 304 and the photoresist is subsequently stripped. The space portion $S^6$ between the first via 312, and the via 314 from the second exposure is related to the space portion $S^5$ in the previous step 355 by the equation: $S^6=S^5-0.5+e$. The next step 357 includes providing a blanket deposition of a thin dielectric layer of thickness d over the dielectric film layer 304 and the vias 312, 314. The following step 358, includes using an anisotropic reactive ion etch of the dielectric film to remove the dielectric layer 318 from the bottom 324 of the vias 312, 314. The remaining thickness of the dielectric on the sidewalls of the vias 312, 314 has a thickness $d^1$. The final via width is $W^2$, and the final width of the space portion 326 between the vias 312, 314 is $S^7$ which relates to the width of space portion 316 of step 356 by the equation: $W^2=W^1-2.0*d^1=(W+e)-2.0*d^1$; and $S^7=S^6+2.0*d^1=(S^5-0.5\ *e)+2.0*d^1$. The final two steps 359, 360 include providing a conductive film deposition over the dielectric layer and in the vias 312, 314. The conductive film is etched off of the dielectric layer leaving the vias 312, 314 with a layer of conductive material 320. The final via width $W^2$ is smaller than the final image width $W^1$ in FIG. 1 because the method 300 shown in FIGS. 5–5A, uses the steps to provide a sidewall (steps 357 and 358), in conjunction with the steps providing multiple exposures (steps 351 and 354) and sequential photoresist film layers 302, 322. Thus, the final spacing portion 326 having a width $S^7$, is smaller than in the previous embodiments because it is not limited by the mechanical integrity of a small photoresist space portion or proximity to a neighboring printed image.

Specifically, referring to FIG. 3, the minimum value of $S^2$ might be limited to approximately 0.67*W. For example, for 248 nm exposures in 0.45 micron thick photoresist, a value of W might be 0.150 microns, and minimum values of S would be ~0.100 microns. Also, typical values of "e" are often small enough to be ignored and can be considered identical to zero for estimation purposes. For this example, therefore, the image density for the case given in FIG. 3 can be estimated as:

$$\begin{aligned}
\text{Image Density of FIG. 3} &= 1/(W^1 + S^3)^2 \\
&= 1/((W+e) + (S^2 - e))^2 \\
&= 1/(W + 0.67 * W)^2 \\
&= 1/((1.67)^2 * (0.150)^2) \\
&= \sim 15.94 \text{ images per square micron}
\end{aligned}$$

Referring to FIGS. 5–5A, the minimum value of "$S^5$" is limited mainly by the mechanical overlay precision of the exposure system and could be given as 0.50*W. Comparing the example given for FIG. 3 to an example for FIGS. 5–5A, (e=0, W=0.150 microns) with an added assumption of $d^1$=0.015 um, the image density for the case given in FIGS. 5–5A can be estimated as:

$$\begin{aligned}
\text{Image Density of FIGS. 5–5A} &= 1/(W^2 + S^7)^2 \\
&= 1/(((W + e) - 2.0 * d^1) + \\
&\quad ((S^5 - 0.5 * e) + \\
&\quad 2.0 * d^1))^2 \\
&= 1/((W - 2.0 * d^1) + \\
&\quad (0.50) * W + 2.0 * d^1))^2 \\
&= 1/(1.50 * W)^2 \\
&= 1/(1.50) * (0.150)^2 \\
&= \sim 19.75 \text{ images per square micron}
\end{aligned}$$

Figure 6:
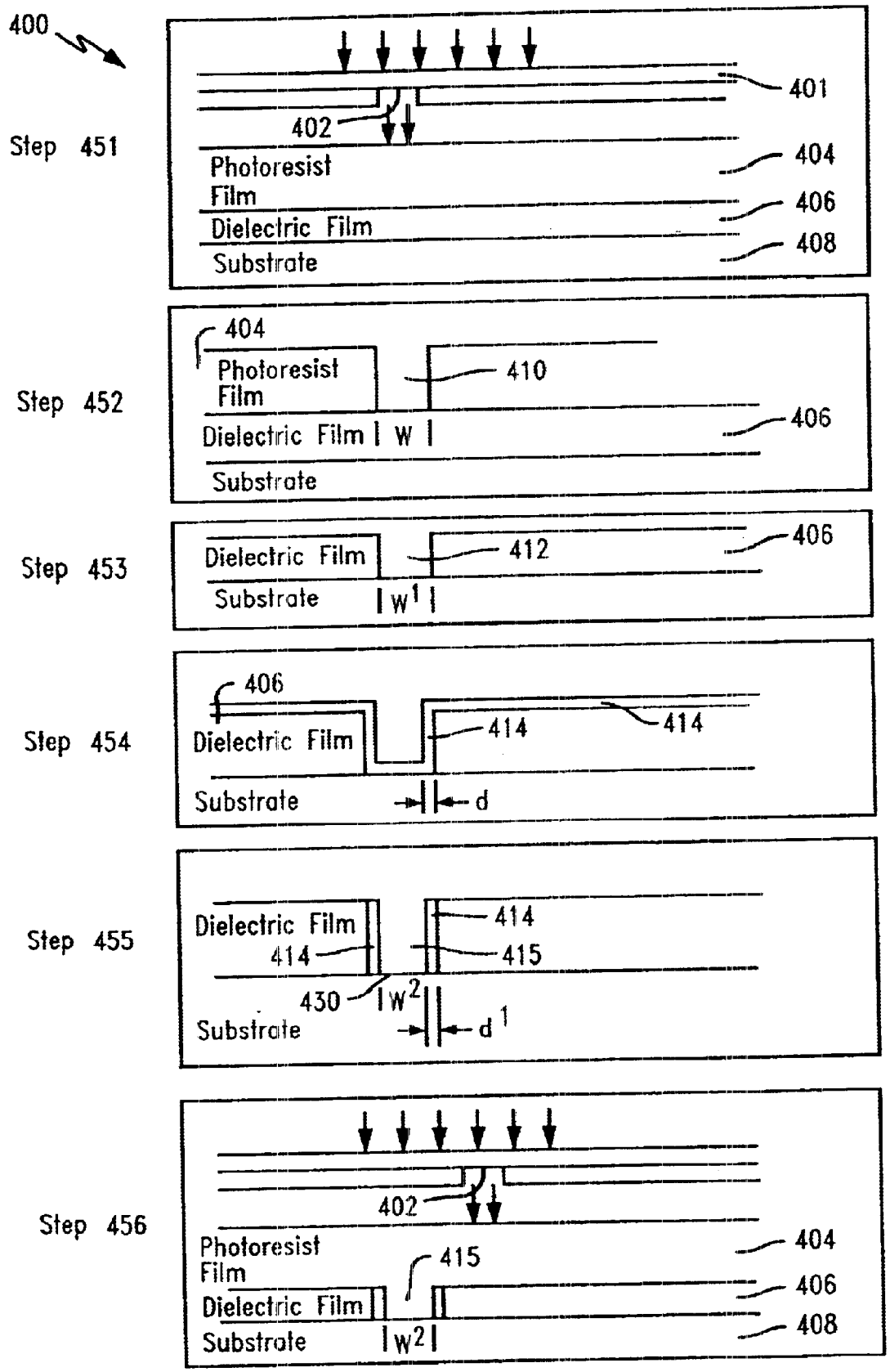
FIGS. 6–6A is a process flow showing another preferred embodiment of the present invention depicting the steps of manufacturing vias on a semiconductor wafer using photolithography, a double exposure process, and a double side wall deposition.
Figure 6A:
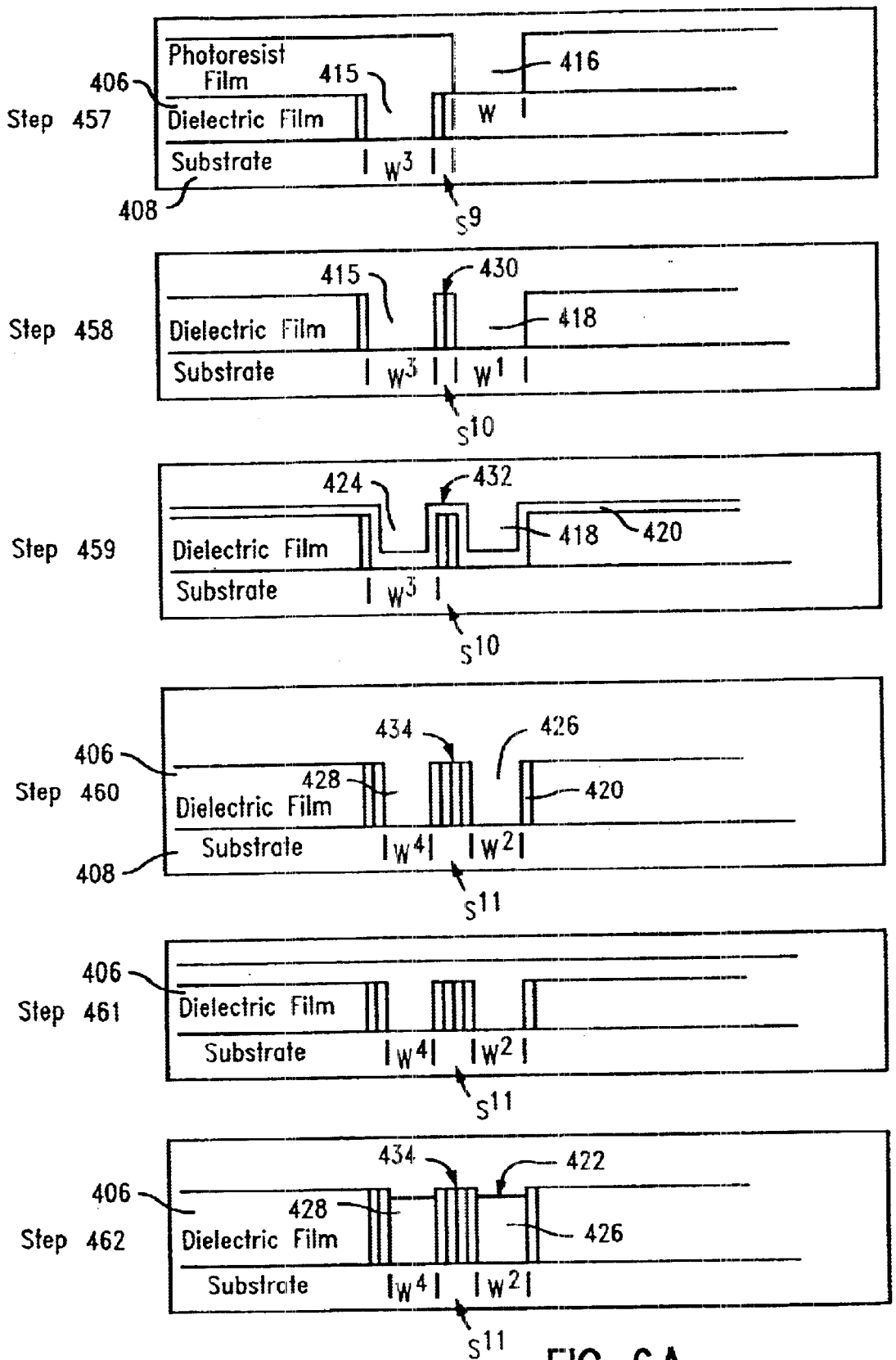

Referring to FIGS. 6–6A, a process 400 is illustrated which depicts another embodiment of the present invention. The process 400 includes two exposures each followed by an etching and deposition. The process 400 initially provides a dielectric layer 406 positioned between a semiconductor substrate or wafer 408 and a photoresist layer 404. The first three steps 451–453, are the same as the steps in the previous embodiment 300, steps 351–353, which result in a via 412 in the dielectric film layer 406 having a width $W^1$. The next step 454, includes depositing a dielectric film 414 having a thickness d over the dielectric layer 406 and over the via 412. In the next step 455, an anisotropic reactive image etch is used to remove the dielectric film 414 from over the dielectric layer 406 and from the bottom 430 of the via 415. The remaining sidewalls 414 in the via 415 has a thickness $d^1$. In the sequential steps 456–458, a second exposure pass is made creating a second via 418 in the dielectric film layer 406 adjacent to the first via 415. The second via 418 is more closely positioned to the first via 415 than when creating the vias by a single exposure pass. Referring to step 458, the first via's 415 width is $W^3$, and is separated from the second via 418 by a space portion 430 having a width $S^{10}$. After the reactive ion etching of the dielectric film and the removal of the remaining photoresist, of step 458, the space portion 430 with width $S^{10}$ can be represented by the equation: $W^1=W+e$ and $S^{10}=S^9-0.5*e$, where e is the etch bias of transferring the image of width W into the dielectric layer with resultant width $W^1$. In the next step 459, a second dielectric film is deposited over the dielectric film layer 406 and in the vias 415, 418 of step 458. In the next step 460, the first via 424 now has a first sidewall layer of dielectric film 414 and a second sidewall layer of dielectric film 420, while the second via 418 has only the second layer of dielectric film 420. Next, another reactive ion etch is completed of the dielectric film 420 from over the dielectric film layer 406, and the bottom of both vias 428, 424 which have widths $W^4$ and $W^2$, respectively, and the space portion 434 between the two vias 428, 426 has a width $S^{11}$. The final dimensions of the vias, the first via 428 having width $W^4$, and the second via 426 having width $W^2$, and the space portion 434 having width $S^{11}$ can be represented by the equations: $W^4=W^2-2.0*d^1=W^1-4.0*d^1=(W+e)-4.0*d^1$; $W^2=W^1-2.0*d^1=(W+e)-2.0*d^1$; and $S^{11}=S^{10}+2.0*d^1=(S^9-0.5*e)+2.0*d^1$. The final two steps final two steps 461, 462 include depositing a blanket conductive film over the dielectric film layer 406 and the vias 428, 426, and removing the excess film to provide the vias 428, 426 with a layer of conductive material 422.

Referring to FIGS. 6–6A, an estimate of what a typical image density might be is disclosed below. It is assumed that W=0.150 microns, d1=0.015 microns, e=~0 microns, and the minimum space value $S^9$ is limited to approximately 0.50*W. The image density is then given as:

$$\begin{aligned}
\text{Image Density of FIGS. 6–6A} &= 1/((W^4 + S^{11}) * \\
&\quad (W^2 + S^{11})) \\
&= 1/((((W + e) - 4.0 * d^1) + \\
&\quad ((S^9 - 0.5 * e) + \\
&\quad 2.0 * d^1)) * \\
&\quad (((W + e) - 2.0 * d^1) + \\
&\quad ((S^9 - 0.5 * e) + 2.0 * d^1))) \\
&= 1/((1.50 * W) - 2.0 * d^1) * \\
&\quad (1.50 * W)) \\
&= \sim 22.79 \text{ images per square micron}
\end{aligned}$$

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming openings on a semiconductor wafer, the method comprising the steps of:
   depositing an initial film layer over said semiconductor wafer;
   depositing a first photoresist layer over a surface of said initial film layer;
   providing an initial image including a first opening in said first photoresist layer using a photolithographic technique;
   creating said first opening in said initial film layer by transferring said image of said first opening into said initial film layer using an etching procedure;
   removing said first photoresist layer;
   depositing a second photoresist layer on said initial film layer;
   providing another image including a second opening in said second photoresist layer using said photolithographic technique;
   creating said second opening in said initial film layer by transferring said image including said second opening into said initial film layer using said etching procedure, and positioning said second opening adjacent to and having a predetermined distance from said first opening;
   removing said second photoresist layer;
   depositing a final film layer over said initial film layer and said first and second openings such that said final film layer covers a horizontal surface of said initial film layer and covers horizontal and vertical surfaces of said first and second openings; and
   anisotropically etching said final film layer from said horizontal surfaces of said first and second openings and said horizontal surface of said initial film layer.

2. The method of claim 1 wherein said predetermined distance between said first and second openings is less than a distance achieved by said photolithographic technique using a single photoresist exposure.

3. The method of claim 1 further comprising the steps of:
   depositing a layer of conductive material on said surface of said initial film layer filling said first and second openings; and
   removing said conductive material from said horizontal surface of said initial film layer.

4. The method of claim 1 wherein said first and second openings include vias.

5. The method of claim 1 wherein said initial and final film layers include a dielectric.

6. The method of claim 1 wherein said first and second openings include interconnecting lines.

7. A method of forming openings on a semiconductor wafer, the method comprising the steps of:
   depositing an initial film layer over said semiconductor wafer;
   depositing a first photoresist layer over a horizontal surface of said initial film layer;
   providing a first opening in said first photoresist layer using a photolithographic technique having a first image;
   creating said first opening in said initial film layer by transferring said first opening into said initial film layer using an etching procedure, said first opening having a horizontal surface and a vertical surface and further having a first width dimension and a first height dimension;
   removing said first photoresist layer from said initial film layer;
   depositing a second film layer over said horizontal surface of said initial film layer and over said vertical and horizontal surfaces of said first opening such that said first opening includes a second width dimension and a second height dimension being less than said first width and height dimensions;
   anisotropically etching said second film layer from said horizontal surface of said initial film layer and from said horizontal surfaces of said first opening such that said first opening includes said first height dimension and said second width dimension;
   depositing a second photoresist layer over said horizontal surface of said initial film layer;
   providing a second opening in said second photoresist layer using said photolithographic technique having a second image;
   creating said second opening in said initial film layer by transferring said second opening in said second photoresist layer into said initial film layer using said etching procedure, positioning said second opening adjacent to and having a predetermined distance from said first opening, said second opening including horizontal and vertical surfaces, and said second opening further having a first width dimension and a first height dimension;
   removing said second photoresist layer;
   depositing a third film layer over said initial film layer and said horizontal and vertical surfaces of said first and second openings such that said second opening includes a second width dimension and a second height dimension being less than said first width and height dimensions of said second opening, and said first opening includes a third width dimension and a third height dimension where said third width dimension is less than said second width dimension; and
   anisotropically etching said third film layer from said horizontal surface of said initial film layer, and said horizontal surfaces of said first and second openings such that said second opening includes said first height dimension and said second width dimension, and said first opening includes said first height dimension and said third width dimension.

8. The method of claim 7 wherein said predetermined distance between said first and second openings is less than a distance achieved by said photolithographic technique using a single photoresist exposure.

9. The method of claim 7 wherein said first and second openings include vias.

10. The method of claim 7 wherein said initial, said second, and said third film layers include a dielectric.

11. The method of claim 7 further including the steps of:
    depositing a conductive material film layer over said initial film layer and filling said first and second openings; and
    removing said conductive material film layer from said horizontal surface of said initial film layer.

12. The method of claim 7 wherein said first and second openings include interconnecting lines.

13. A method of forming openings on a semiconductor wafer, the method comprising the steps of:

providing a first film layer on a horizontal surface of said semiconductor wafer;

providing an image of a first opening on a photoresist layer using a photolithographic technique, said photoresist layer being positioned on a horizontal surface area of said first film layer;

creating said first opening in said first film layer by transferring said image of said first opening on said photoresist layer into said first film layer using an etching procedure, said opening includes horizontal and vertical surfaces and further defines first width and height dimensions;

removing said photoresist layer;

repeating said steps of providing said image, creating said first opening, and removing said photoresist layer to provide a second opening in said first film layer, said second opening being adjacent to and having a predetermined distance from said first opening where said predetermined distance between said first and second openings is less than a distance achieved by said photolithographic technique using a single photoresist exposure;

depositing a second film layer over said first film layer and said horizontal and vertical surfaces of said openings such that said openings have a second width and a second height dimension being less than said first width and height dimensions;

anisotropically etching said second film layer from said horizontal surface area of said first film layer and from said horizontal surfaces of said openings, such that said openings include said first height dimension and said second width dimension;

depositing a conductive material film layer over said first film layer which fills said openings; and removing said conductive material film layer from said horizontal surface area of said first film layer.

14. The method of claim 13 wherein said first and second film layers include a dielectric.

15. The method of claim 13 further including the step of applying a layer of antireflective coating onto a top surface of said wafer before the step of providing an image.

16. The method of claim 13 wherein said semiconductor wafer comprises silicon.

17. A method of forming openings on a semiconductor wafer, the method comprising the steps of:

providing a first film layer over said semiconductor wafer;

providing an image of a first opening on a photoresist layer using a photolithographic technique, said photoresist layer being positioned over a horizontal surface of said first film layer;

creating said first opening in said first film layer by transferring said image of said first opening on said photoresist layer into said first film layer using an etching procedure, said first opening including horizontal and vertical surfaces and having first width and height dimensions;

removing said photoresist layer;

depositing a second film layer over said first film layer and said opening such that said opening has a second width and height dimensions being less than said first width and height dimension;

anisotropically etching said second film layer from said horizontal surface of said opening such that said opening includes said first height dimension and said second width dimension, and further anisotropically etching said second film layer from said horizontal surface of said first film layer;

repeating said steps of providing said image, creating said first opening, removing said photoresist layer, depositing said second film layer, and anisotropically etching to provide a second opening in said first film layer, said second opening being adjacent to and being a predetermined distance from said first opening, and said first and second openings having different said width dimensions;

depositing a conductive material film layer over said first film layer which fills said openings; and removing said conductive material film layer from said horizontal surface of said first film layer.

18. The method of claim 17 wherein said first and second film layers include a dielectric.

19. The method of claim 17 further including the step of applying a layer of antireflective coating onto a top surface of said wafer before the step of providing an image.

20. The method of claim 17 wherein said semiconductor wafer comprises silicon.

21. A method of forming openings on a semiconductor wafer, the method comprising the steps of:

depositing an initial film layer over said semiconductor wafer;

depositing a photoresist layer over a horizontal surface of said initial film layer;

providing an opening in said photoresist layer using a photolithographic technique having an image;

creating said opening in said initial film layer by transferring said opening in said photoresist layer into said initial film layer using an etching procedure, said opening including horizontal and vertical surfaces;

removing said photoresist layer;

repeating said steps of depositing said photoresist layer, providing said opening, creating said opening, and removing said photoresist layer to provide additional openings being adjacent to and a predetermined distance from each other;

depositing an additional film layer over said initial film layer and said horizontal and vertical surfaces of said openings; and anisotropically etching said additional film layer from said horizontal surfaces of said openings, and said horizontal surface of said initial film layer.

22. The method of claim 21 wherein the step of, repeating said steps of depositing said photoresist layer, is performed after the steps of depositing an additional film layer, and anisotropically etching, and the step of repeating said steps of depositing said photoresist layer includes repeating the steps of depositing said additional film layer, and anisotropically etching.

23. The method of claim 21 further comprising the steps of:

depositing a conductive material film layer over said horizontal surface of said initial film layer which fills said openings; and removing said conductive material film layer from said horizontal surface of said initial film layer.

24. The method of claim 22 further comprising the steps of:

depositing a conductive material film layer over said horizontal surface of said initial film layer which fills said openings; and removing said conductive material film layer from said horizontal surface of said initial film layer.

25. The method of claim 21 where in the steps are performed in the sequence provided.

* * * * *